(12) United States Patent
Hildebrandt (10) Patent No.: US 6,552,901 B2
(45) Date of Patent: Apr. 22, 2003

(54) APPARATUS AND SYSTEM FOR COOLING ELECTRONIC CIRCUITRY, HEAT SINKS, AND RELATED COMPONENTS

(76) Inventor: James Hildebrandt, P.O. Box 248, Truro, MA (US) 02652

( * ) Notice: Subject to any disclaimer, the term of this patent is extended or adjusted under 35 U.S.C. 154(b) by 0 days.

(21) Appl. No.: 09/974,335

(22) Filed: Oct. 10, 2001

(65) Prior Publication Data

US 2002/0041486 A1 Apr. 11, 2002

Related U.S. Application Data

(63) Continuation-in-part of application No. 09/465,428, filed on Dec. 21, 1999, now Pat. No. 6,313,992.
(60) Provisional application No. 60/113,332, filed on Dec. 22, 1998.

(51) Int. Cl.$^7$ .................................................. H05K 7/20
(52) U.S. Cl. ....................... 361/700; 361/702; 361/704; 361/723; 165/104.13; 165/104.33; 29/860; 29/861
(58) Field of Search ................................. 361/683, 687, 361/698–704, 717–723, 707, 749, 690, 713; 174/15.1, 24, 94 R, 94 S, 74 R; 165/80.2, 80.3, 80.4, 104.32, 104.33, 104.34, 104.13; 62/304, 907, 314–316; 122/366; 257/706–727; 29/860, 861

(56) References Cited

U.S. PATENT DOCUMENTS

| | | | | |
|---|---|---|---|---|
| 3,725,566 A | * | 4/1973 | Plizak | ....................... 174/15 R |
| 3,746,947 A | | 7/1973 | Yamamoto et al. | |
| 4,392,153 A | | 7/1983 | Glascock, II et al. | |
| 4,573,067 A | | 2/1986 | Tuckerman et al. | |
| 4,614,227 A | * | 9/1986 | Vogel | ......................... 165/80.4 |
| 4,838,041 A | * | 6/1989 | Bellows et al. | ............... 62/51.2 |
| 4,897,762 A | | 1/1990 | Diakoku et al. | |
| 5,049,973 A | | 9/1991 | Satriano et al. | |
| 5,131,233 A | | 7/1992 | Cray et al. | |
| 5,239,200 A | | 8/1993 | Messina et al. | |
| 5,310,440 A | * | 5/1994 | Zingher | ....................... 156/345 |
| 5,345,107 A | | 9/1994 | Daikoku et al. | |
| 5,373,417 A | | 12/1994 | Barrett | |
| 5,491,363 A | * | 2/1996 | Yoshikawa | ................... 257/715 |
| 5,520,244 A | * | 5/1996 | Mundinger et al. | ..... 165/104.33 |
| 5,719,444 A | | 2/1998 | Tilton et al. | |
| 5,777,384 A | | 7/1998 | Root et al. | |
| 5,818,692 A | | 10/1998 | Denny et al. | |
| 5,880,931 A | | 3/1999 | Tilton et al. | |
| 5,998,240 A | | 12/1999 | Hamilton et al. | |

* cited by examiner

Primary Examiner—Darren Schuberg
Assistant Examiner—Michael Datskovsky
(74) Attorney, Agent, or Firm—Thomas A. Kahrl, Esq.

(57) ABSTRACT

Apparatus and systems for cooling heat sinks, integrated circuit boards, and electronic components by providing internal passageways in the heat sinks, circuit boards, and electronic components that connect to a fluid manifold. The internal passageways connect to the surface of the heat sinks, circuit boards and electronic components. A cooling fluid capable of phase change is supplied to the internal passageways to conductively cool the interior of the heat sink, circuit board, and component and to cool the surface of the heat sink, circuit board, and/or component at least partially by evaporative cooling. A plurality of circuit boards, components, and/or heat sinks may be placed back to back with the fluid manifold therebetween. The heat sinks, circuit boards, and/or components are in an enclosed space so that cooling fluid can be contained, condensed and recycled to the fluid manifold.

23 Claims, 5 Drawing Sheets

APPARATUS AND SYSTEM FOR COOLING ELECTRONIC CIRCUITRY, HEAT SINKS, AND RELATED COMPONENTS

CLAIM OF PRIORITY

This application is a continuation-in-part application and claims priority From U.S. Application No. 09/465,428 filed Dec. 21, 1999 now U.S. Pat. No. 6,313,992, which claims the benefit of U.S. Provisional Application No. 60/113,332 filed Dec. 22, 1998.

BACKGROUND OF THE INVENTION

1. Field of the Invention

This invention relates generally to the cooling of electronic circuitry, integrated circuit boards, heat sinks, and power electronic components to increase their power density. Most electrically energized equipment is limited in its capacity by thermal constraints. The advent of more electric vehicles such as ships, transportation equipment including cars, trucks, aircraft and trains has pushed the capabilities of many electronic controls to their maximum thermal constraints These constraints have a direct effect on efficiency, power density, packaging and the architectural configuration for these components in their operating environments.

Each year additional software and hardware is required by electronic systems in order to meet customer expectations, particularly in power electronics. Increasingly there are many applications where significantly higher power is required and space is at a premium. Efficiency and power density may be compromised by the addition of more cumbersome traditional integrated circuit cooling systems utilizing cold plates and traditional spray cooling methods. There are many applications where this is not a significant issue, however, there are an increasing number of environments, such as with power electronics where power density must be optimized to enable such applications to be commercialized.

One such example is the current interest in the introduction of hybrid/electric propulsion systems in transportation. Power density is a critical factor in determining overall fuel efficiency of the platform. It is critical to reduce an electrical component's size to achieve lightweight, cost-effective components.

The present invention relates to a significantly more effective method and apparatus for the removal of latent heat from integrated circuit boards, heat sinks, electric coils, integral power busses and their components. I have found that a significant increase in power density is achieved by utilizing the integrated circuit board and/or their components and/or associated heat sinks as the injection source in the spray cooling process. By cooling electronic components in accordance with the principles of the invention, two significant factors are accomplished. In the first, the heat is more effectively removed directly from the source of the heat generated. This helps to eliminate any unnecessary high and low pressure regions integral to the environment in which the components are encased. The second factor is the elimination of additional manifolds and injectors to nebulize liquids which add to a system's complexity, requires more space, adds additional cost and increases the relative amount of maintenance.

2. Description of Related Art

U.S. Pat. No. 5,719,444 discloses a packaging and cooling system for one or more semi-conductor devices in which an evaporative type liquid coolant is sprayed from a plurality of spray nozzles onto the semi-conductor devices and the liquid is then condensed, cooled and recirculated by a pump to an input plenum for reuse in a closed circuit.

U.S. Pat. No. 5,880,931 discloses a spray cooled circuit card cage which includes a manifold to provide coolant fluid to a plurality of spray plate assemblies which direct the spray of coolant over the top surface of the electronic cards within the card cage.

U.S. Pat. No. 4,392,153 discloses a semi-conductor electronic device which is attached to fluid cooled heat sinks to provide efficient removal of heat generated by the device.

U.S. Pat. No. 4,573,067 discloses a semi-conductor chip which is provided with fins to provide improved heat dissipation capability.

U.S. Pat. No. 5,23 9,200 discloses a heat transfer module which is placed into thermal contact with a chip on a circuit board for conducting heat therefrom. The heat transfer module has a channel therein for receiving a coolant.

U.S. Pat. No. 5,345,107 discloses a cooling apparatus for an electronic device in which a cooling body is placed into surface contact with an electronic device.

U.S. Pat. No. 5,049,973 discloses a heat sink for electrical components.

U.S. Pat. No. 5,373,417 discloses a liquid cooled circuit package where the package is filled with a cooling liquid during operation.

U.S. Pat. No. 3,746,947 discloses a semi-conductor device which is positioned with an enclosure which has liquid coolant circulating therein.

None of the foregoing prior art suggested ports, perforations or passageways in the circuit board, the components themselves, the heat sinks, or the conductive leads for the components to promote internal cooling of the components by conduction, and cooling of the surface of the components by evaporative and conductive cooling.

SUMMARY OF THE INVENTION

The present invention provides a method and apparatus for addressing a significant obstacle in increasing power density of integrated circuit boards and their components during the spray cooling process. Many features, embodiments and principles of the present invention are disclosed in U. S. patent application Ser. No. 091465,428 entitled Method and Apparatus for Increasing the Power Density of Integrated Circuit Boards and Their Components filed on Dec. 21, 1999. That application and all is contents and disclosures are hereby incorporated herein by reference.

Substantial inefficiencies occur in traditional systems that attempt to remove heat from energized circuit board components. One traditional system is the spray cooling process. In that system nozzles or injectors typically are placed adjacent to a board in the proximity of the energized components. The nozzles or injectors spray nebulized cooling fluid down onto the circuit board and its components. The cooling fluid then evaporates removing heat from the circuit board and its components. In the typical closed loop system, the vapor must be collected, condensed, and circulated back to the nozzles or injectors.

In the present invention, cooling fluid is supplied to passageways within an integrated circuit board and/or its components and/or heat sinks. The fluid passes through the passageways and exits through ports or nozzles on the surface of the integrated circuit board, components or heat sink. Thus, the components may be cooled by both conductive cooling as the fluid passes through the core of the component, circuit board, or heat sink and by evaporative cooling as the liquid changes phase at or near the surface of the component, circuit board, or heat sink.

More traditional spray-cooling designs have to overcome a multitude of obstacles. These obstacles are a result of trying to direct coolants towards, as opposed to away from, the energized components on an integrated circuit board. This results in unnecessary increased boundary layers and vortices during phase change. This is due to vapors having to escape the area where the fluid vaporized directly in opposition to the direction of the spray pattern during the cooling process. Thus, the heat removal in the traditional spray-cooling process is less efficient than in the present invention. It should be emphasized that this invention may provide for some of its coolants to reach the board in liquid form, however, significant advantages are accomplished by using the integrated circuit board as the source of the cooling fluid. The net effect is increased power density.

Thermal instabilities can create mechanical fatigue over time particularly, in high power density applications where temperatures may vary significantly from one location in a component as compared to another. This is becoming a common occurrence in cold plate cooling creating separations or fractures and is avoided in the utilization of the subject invention. The core of a component maintains a more consistent temperature as does the outer surface while employing the principles of this invention. On a microprospective, dissimilar temperatures also inhibit the free passage of electrons which is ultimately a function of increased resistance and affects the overall efficiency and equilibrium in an integrated circuit board and its components Thermal inconsistencies and mechanical instabilities may also result in increased audible/radiated and electrical noise in addition to fatigue.

One embodiment of the present invention can be carried out in a manner where a continuous supply of liquid coolants are provided to an integrated circuit board, a heat sink, a pair of boards set back-to-back, or a board set back-to-back with a heat sink. When two boards are set back-to-back, sufficient space may be provided between the two boards to provide a chamber for the introduction of coolants. The peripheral edges of the boards are joined and sealed creating a void or chamber within a sandwich-like enclosure to allow the two boards to act as an intake manifold for liquid coolants. Boards may be dielectrically isolated or conductively connected to one anther through the surrounding attachments making up the enclosure. The choice would depend on whether each board has similar or dissimilar power requirements. If power requirements are dissimilar, the boards must be dielectrically isolated or have an appropriate stepper. Power supplies, microprocessors, SCR's, IGBT's, voltage steppers, invertors, rectifiers, surge capacitors, batteries, or regulators may be strategically placed on these surfaces between the two boards.

Alternatively, such components may be individually mounted to a manifold adapted to supply cooling fluid to the components.

The present invention also may be used to increase the efficiency of heat sinks. As with the other applications of the invention, a heat sink is provided with internal passages through which cooling fluid is passed. The passages end at a port or nozzle on the surface of the heat sink. Cooling fluid may be supplied to the heat sink by way of a manifold or by placing the heat sink back-to-back with a circuit board. The peripheral edges of the board and heat sink are joined and sealed creating a void or chamber within a sandwich-like enclosure to act as an intake manifold for liquid coolants.

An additional alternate embodiment of the invention is the attachment of a manifold to the bottom of a single integrated circuit board or heat sink utilizing the board or heat sink to provide at least one surface an enclosed fluid chamber. Alternatively, such a manifold could be attached to a single component such as a transformer.

The inlet chamber between the boards or the board and the heat sink or the intake manifold enables the introduction of the liquid through openings in components mounted thereto and/or through openings in the board or the heat sink itself. If desired, a nozzle or nozzles may be connected to perforations in the board or heat sink to direct cooling fluid onto specific components. Alternatively, ports or nozzles may be positioned above the surface of the board to allow cooling fluid to be sprayed down onto components mounted on the board. Regulation of the openings is managed by the size and placement of perforations or inlets relative to cooling requirements in the system's architecture. Generally, the closer a component is to an inlet, the larger the intake delivery port that is required to provide adequate pressure to that component. Conversely, the further a component is located from the inlet, the smaller the intake delivery port that is necessary to maintain adequate pressure. This design mimics a biological capillary design. It provides for better interaction of the liquid, electron and gas exchange allowing for the component's substrates to act as a membrane like our skin thus, more closely mimicking a biological system such as that found in the human body.

Yet, another way to visualize this micro-port configuration, from a turbulence perspective, is to more closely emulate the design of a feather. This design also helps to evacuate vapor directing it towards the cooling source. This is a result of continually homogenizing respectively large vortices and reducing their size and increasing acceleration when the gas stream approaches the vapor exit of the chamber and exits to the cooling source. The cooling source in some cases may be the enclosure itself of these components. The placement of high heat components such as power supplies, magnetics, SCR's and IGBT's or transformers near the inlet side of the board may also help the natural acceleration of vapor to the cooling source. This design also helps to evacuate vapor directing it towards the cooling source.

This results in a reduction of unnecessary vortices. When two boards are placed back-to-back, it allows the mounting of components on both sides of what becomes a single integrated circuit board with an internal fluid filled chamber. The liquid can be directed away from an integrated circuit board effectively in any direction in this configuration. It is therefore an object of the present invention to provide methods and apparatus for increasing the effectiveness of the spray cooling for integrated circuit boards, their components, and heat sinks.

It is an additional object of the invention to provide for effectively cooling the conductive source and the integrated circuit board from within and on the surface. This increases the overall carrying capacity of the conductive infrastructure, including the buss, by providing a more uniformed temperature with a simple more unified transition of heat removal.

It is still an additional object of this present invention to improve the power density of the components attached to and utilized as an integral part of an injection manifold where the components themselves contain internal passages and perforations thus, rendering them all part of a fully integrated injection and nebulizing system.

The aforementioned objects and advantages of the present invention, as well as additional objects and advantages thereof, will be more fully understood from the following detailed description of the preferred embodiments when taken in conjunction with the following drawings. It should be understood, however, that the detailed description and the specific examples while representing the preferred embodiments are given by way of illustration only and should not be construed in a limiting sense.

DETAILED DESCRIPTION OF PREFERRED EMBODIMENTS

The following description is of the best presently contemplated modes of carrying out the invention This description is made for the purpose of illustrating the general principles of the invention and should not be taken in a limiting sense.

Figures 1, 1A:
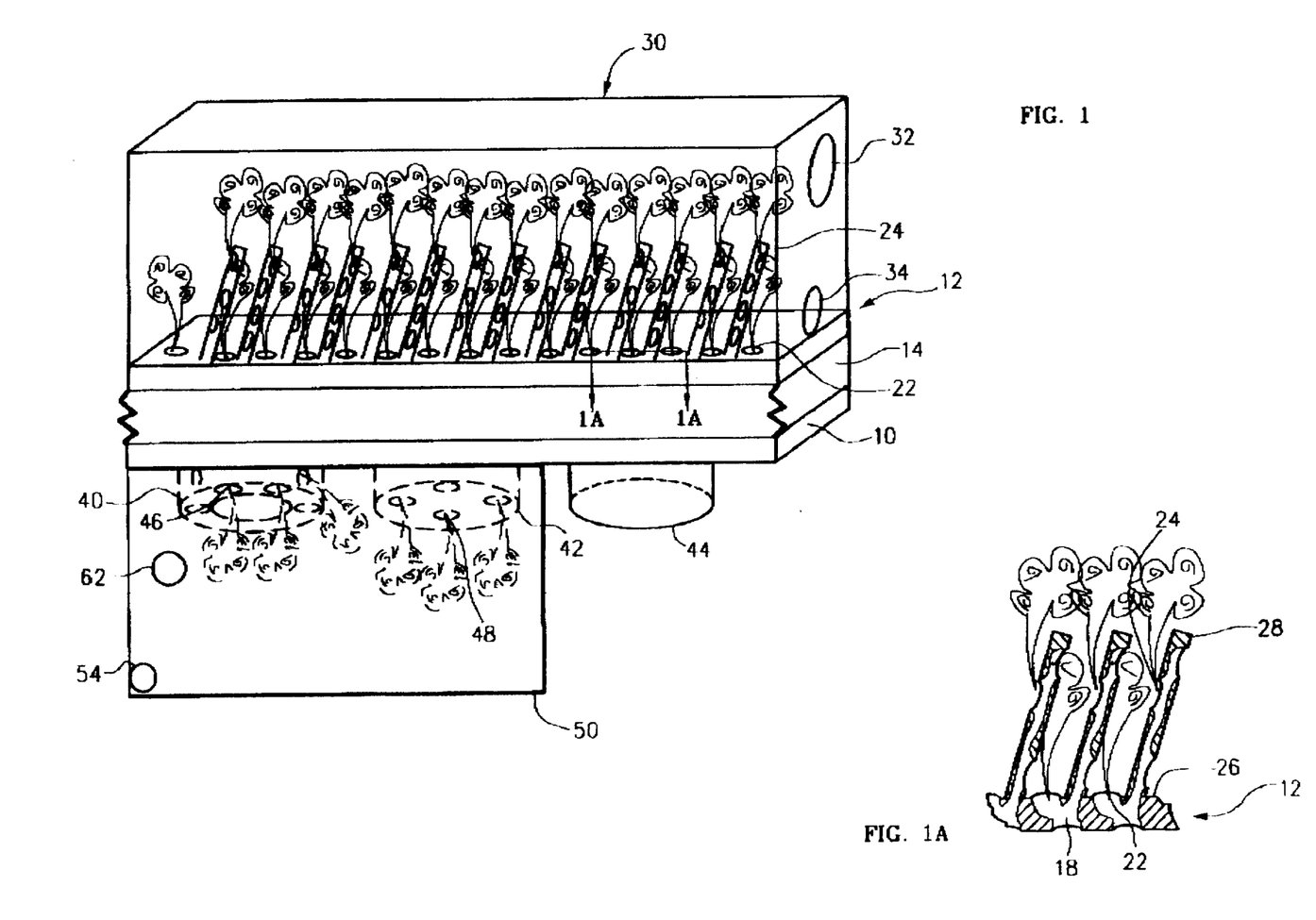
FIG. 1 is a perspective view of a heat sink and an integrated circuit board and its components illustrating the board, components and heat sink acting as a fully integrated manifold injection system in accordance with the principals of the invention.
FIG. 1A is a cut-away view along line 1A in FIG. 1 showing some of the internal passageways within the heat sink.

In accordance with the present invention, FIG. 1 shows an integrated circuit board or die 10 spaced from a heat sink 12 to form an enclosed chamber or injection manifold 14 therebetween for cooling fluid. Cooling fluid is provided under pressure to manifold 14. The fluid may be pressurized by a pump or other conventional means. Alternatively, the manifold 14, heat sink 12 and circuit board or die 10 may act as the evaporator side of a heat pipe. In the latter case, the cooling fluid is pressurized by the heat differential between the evaporator side of the heat pipe (i.e. the manifold 14, heat sink 12 and circuit board 10) and the reservoir of cooling fluid (not shown) that supplies the cooling fluid to manifold 14. A plurality of openings (not shown) are provided in the circuit board or die 10 and the heat sink 12 to allow cooling fluid to exit from the manifold 14 and flow through internal passageways (the interior passageways of heat sink 12 are shown in FIG. 1A) into the interior of the circuit board or die 10 and the interior of heat sink 12.

FIG. 1A shows a cut-away view of heat sink 12. Internal passageways 18 may connect to ports or nozzles 22 and 24 on the base 26 of heat sink 12 or on the fins 28 of heat sink 12 to allow the cooling fluid to exit the interior of heat sink 12. Depending on the specific requirements of the application, heat sink 12 may be constructed with ports or nozzles only on the base 26, only on the fins 28, or with ports on both the base 26 and the fins 28. The ports or nozzles 22 and 24 may be constructed to direct cooling fluid onto the fins 28 of the heat sink 12 to allow the cooling fluid to cool the fins 28 of the heat sink 12 through evaporative cooling.

In FIG. 1, Heat sink 12 is shown enclosed in environmental housing 30 to allow for the collection of the cooling fluid that has exited from heat sink 12. Once the cooling fluid has been collected, the fluid is recycled back into the manifold 14. Port 32 in housing 30 allows for the collection of cooling fluid that has vaporized and port 34 in housing 30 allows for the collection of any cooling fluid in liquid form. Any vaporized cooling fluid is condensed, collected and recycled back into manifold 14. The collection, condensation and recycling of the cooling fluid may be accomplished with generally utilized components such as radiators, intercoolers or compressors as well as filters, pumps and regulators which are generally known within the art If container 12 exists in a cool enough environment, port 32 may not be necessary as the cooling fluid may condense on the surface of housing 30. In that case, the cooling fluid is collected, for example, through port 34 and again supplied to manifold 14.

FIG. 1 also shows components 40, 42, and 44 attached to circuit board or die 10. Components 40 and 42 may be, for example, semiconductor components that are perforated to allow cooling liquid to pass from manifold 14 through the components and exit through ports in the surface of components 40 and 42 such as ports 46 and 48. Detailed descriptions of the invention with respect to components 40, 42, and 44 and circuit board or die 10 are contained in U.S. Pat. application Ser. No. 09/465,428. That application and all its contents and disclosures are incorporated herein by reference. Component 44 may be a semiconductor component that is not perforated and does not allow cooling fluid to pass through the component. Thus, component 44 is at least partially cooled by transferring heat through circuit board 10 to the cooling fluid located in manifold 14.

Components 40 and 42 are contained within environmental housing 50. As with housing 30, housing 50 may contain ports 52 and 54 for the collection of both vaporized cooling fluid or liquid cooling fluid. Alternatively, a port for the collection of vaporized cooling fluid may not be necessary if housing 50 is located in an environment cool enough to condense the cooling fluid on the surface of housing 50.

It is important to note that the specific design of any such housing may vary depending on the requirements of the specific application to which the invention is applied. For example, a single component may be supplied with its own housing. Alternatively, multiple components may share the same housing. A further alternative is to have multiple circuit boards each with many components contained within one common housing such as a VME case. If multiple circuit boards are contained within one common housing, the boards may be positioned such that the nozzles or ports in one board direct cooling spray onto an adjacent board and the components thereon.

Figure 2:
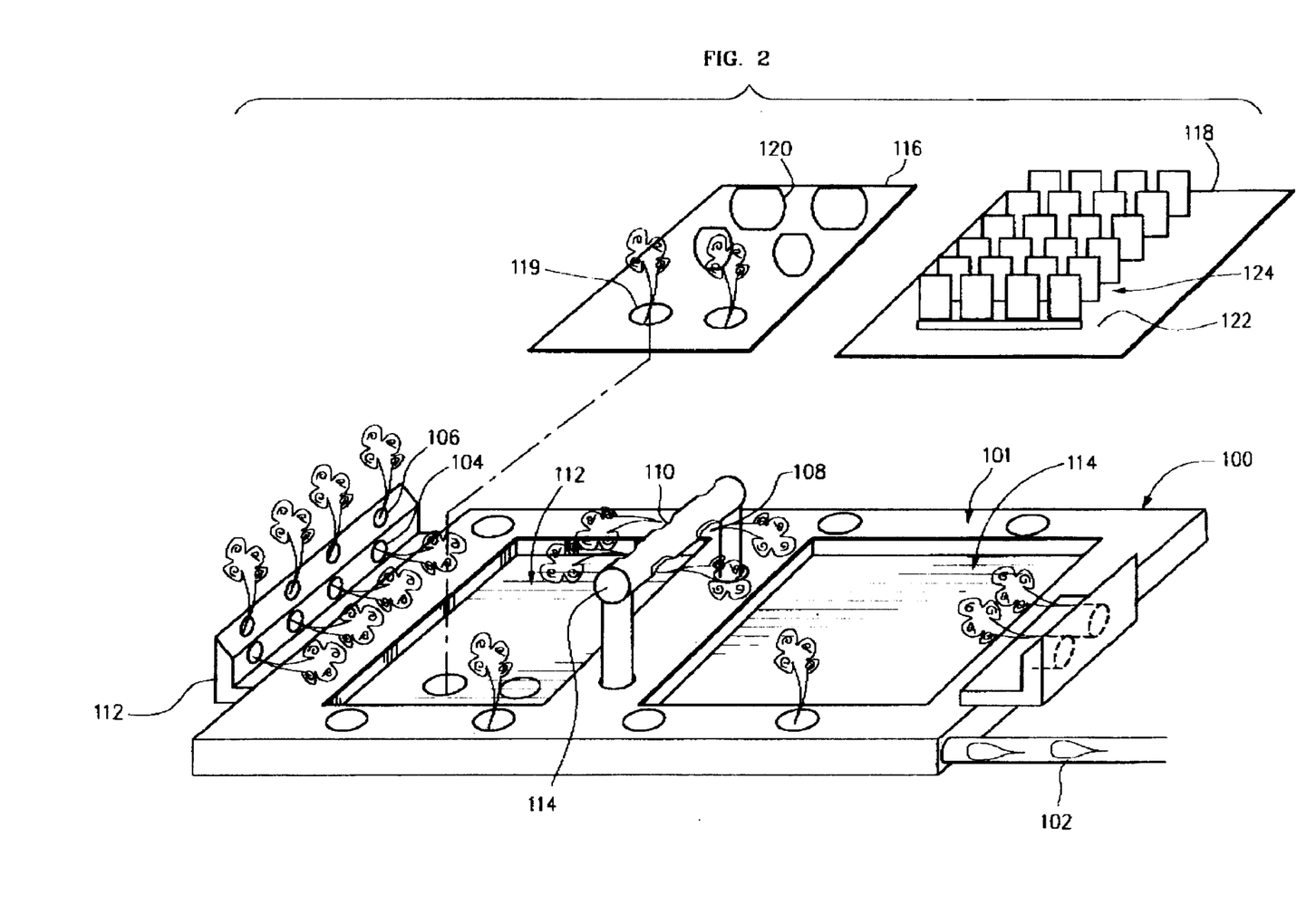
FIG. 2 is a perspective view of a cooling manifold constructed in accordance with the principles of the invention.

FIG. 2 shows an alternative embodiment of the invention. Cooling fluid is provided under pressure to manifold 100 by supply line 102. The fluid may be pressurized by a pump or other conventional means. Alternatively, the manifold 100 may act as the evaporator side of a heat pipe. In the latter case, the cooling fluid is pressurized by the heat differential between the evaporator side of the heat pipe (i.e. the manifold 100) and the reservoir of cooling fluid (not shown) that supplies the cooling fluid to manifold 100. The cooling fluid exits manifold 100 through a series of ports or nozzles such as ports 104, 106, 108 and 110. As shown in FIG. 2, the ports may be located above the top surface 101 of manifold 100. A variety of means may be employed to locate ports or nozzles above the surface 101 of manifold 100. For example, manifold 100 may be constructed such that protrusion 112 extends above the surface 101 of manifold 100 and ports such as ports 104 and 106 may be located on protrusion 112. Note that ports 104 and 106 may be constructed to direct cooling fluid in a variety of different directions including angled down towards the surface 101 of manifold 100, horizontal to the surface 101 of manifold 100 or away from the surface 101 of manifold 100. A plurality of integrated circuit boards or dies may be arranged to use a common manifold.

One reasonably skilled in the art will appreciate that many alternate structures may be used to construct protrusions from surface 101. One alternate protrusion structure 114 is shown in FIG. 2. Note that use of protrusion structure 114 or other similar structures allows ports such as ports 108 and 110 to be located to direct cooling fluid in virtually any direction including directly down onto heat sinks, components, circuit boards, or dies associated with manifold 100. Note that protrusions 112 and 114 are connected to manifold 100 to allow manifold 100 to supply cooling fluid to any ports or nozzles located on such protrusions such as ports 104, 106, 108 and 110.

Manifold 100 may contain cavities 112 and 114 that are adapted to receive circuit boards, dies, or heat sinks such as circuit board 116 and heat sink 118. Note that circuit board 116 and/or the components thereon such as component 120 may be operatively connected to manifold 100 to allow manifold 100 to supply cooling fluid to circuit board 116 and/or the components thereon such as component 120. Accordingly, ports or nozzles 119 may be located on circuit board 116 and/or on the components thereon such as component 120. Similarly, a heat sink, such as heat sink 118, may be operatively connected to manifold 100 to allow manifold 100 to supply cooling fluid to the heat sink. As detailed in FIGS. 1 and 1A and the accompanying description, ports or nozzles may be located anywhere on the heat sink including the base 122 or the fins 124.

Manifold 100 may be constructed to fit into a standardized slot such as a slot in a VME case. Note that by use of protrusions such as protrusions 112 and 114 and directional ports or nozzles, manifold 100 may be adapted to direct cooling liquid in virtually any direction including onto circuit boards or components adjacent to manifold 100 such as circuit boards located in an adjacent slot in a VME case.

Although no environmental housing is shown associated with manifold 100, one reasonably skilled in the art will realize that manifold 100 is contained within some sort of enclosure to allow the cooling fluid that exits manifold 100, whether in liquid or vapor form, to be collected, condensed and returned to manifold 100. It is important to note that more than one cooling manifold such as manifold 100 may be contained within the enclosure for collecting the cooling fluid.

Figures 3A, 3B:
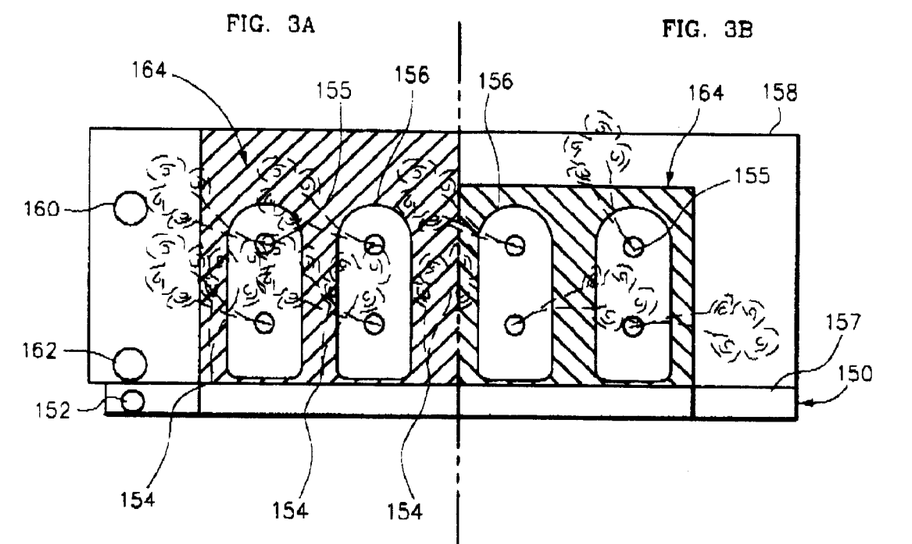
FIGS. 3A and 3B are cut-away side views of an integrated circuit board and its components illustrating how different configurations of mesh or other heat sink material may be used in accordance with the principles of the invention.

FIGS. 3A and 3B show alternate ways that mesh or other heat sink material may be used in accordance with the principles of the present invention. There are materials readily available, such as conductive or non-conductive mesh which are suitable. The mesh or other heat sink material helps to maintain a consistent temperature across non-injected components, injected components and cooling manifolds. Cooling fluid is supplied to manifold 150 through supply line 152. Cooling fluid may exit manifold 150 through ports 154 in circuit board 157 and/or ports 155 in components 156. Components 156 that are attached to circuit board 157 are sealed within housing 158. Housing 158 has port 160 to collect vaporized cooling fluid and port 162 to collect liquid cooling fluid. As shown in FIG. 3A, the mesh or other heat sink material 164 may abut the surface of both components 156 and the interior surface of housing 158. That arrangement is advantageous when the components 156 and housing 158 are located in a relatively cool environment such that a substantial amount of vaporized cooling fluid may condense on the interior of housing 158. FIG. 3B shows an alternate arrangement of the mesh or heat sink material 164 in which the mesh or heat sink material 164 abuts the surface of components 156 but is spaced from the interior surface of housing 158. That arrangement is advantageous when the components 156 and housing 158 are located in a relatively warm environment such that a substantial amount vaporized cooling fluid will not condense on the interior of housing 158. Alternatively the mesh or heat sink material may be spaced from the components and abut the interior surface of the housing or the mesh or heat sink material may be spaced from both the components and the interior surface of the housing.

Figure 4:
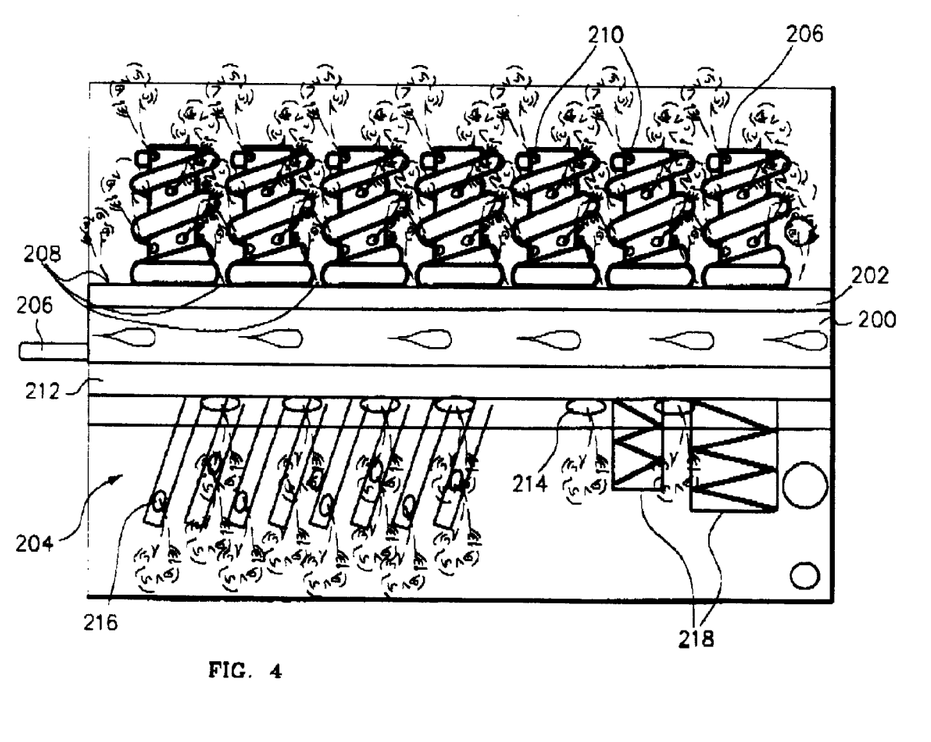
FIG. 4 is a side view of a linear array of coils arranged back-to-back with a heat sink and a transformer illustrating the coil array, heat sink and transformer acting as a fully integrated manifold injection system in accordance with the principals of the invention.

FIG. 4 illustrates one way that the present invention may be applied to a linear array of coils. Such an array may be used as the stator portion of a linear motor or a rail. One reasonably skilled in the art will appreciate that such coils may be placed in a large number of different configurations depending on the specific application. As shown in FIG. 4, an enclosed chamber or injection manifold 200 is formed between circuit board or die 202 and the base 212 of a heat sink designated generally as 204. Coils 206 are attached to circuit board or die 202. Coils 206 may or may not be perforated to assist in cooling in accordance with the principles of the present invention. In addition, circuit board or dye 202 may be perforated to allow cooling fluid to pass through circuit board or die 202. In addition, the base of coils 206 may be perforated to assist in the cooling of coils 206. Nozzles or ports may be employed to direct cooling fluid onto the surface of coils 206 or in any other desired direction.

Cooling fluid is supplied under pressure to chamber 200 by supply line 206. The fluid may be pressurized by a pump, temperature differentiation, or other conventional means. Alternatively, chamber 200, circuit board or die 202, coils 206, and heat sink 204 may act as the evaporator side of a heat pipe. In the latter case, the cooling fluid is pressurized by the heat differential between the evaporator side of the heat pipe (i.e. chamber 200, circuit board or die 202, coils 206, and heat sink 204) and the condenser or reservoir of cooling fluid (not shown) that supplies the cooling fluid to chamber 200. The cooling fluid may exit chamber 200 though ports or nozzles 208 in circuit board or die 202. Ports or nozzles 208 may be constructed to direct nebulized cooling fluid onto coils 206. In addition, coils 206 themselves may be perforated to allow fluid to pass from chamber 200, through the interior of coils 206 and out through ports or nozzles 210 on the surface of coils 206. In addition, the base of coils 206 may be perforated to allow passage of the cooling fluid.

Cooling fluid may also exit chamber 200 through passageways located in the interior of heat sink 204 as detailed in FIGS. 1 and 1A and the accompanying description. The cooling fluid may exit the interior of heat sink 204 through ports or nozzles 214 located on the base 212 of heat sink 204. In addition, the cooling fluid may exit the interior of heat sink 204 through ports or nozzles 216 located on the fins of heat sink 204. Ports or nozzles 214 and 216 may be constructed to direct cooling fluid onto the fins on heat sink 204 and/or onto transformer 218.

Figure 5:
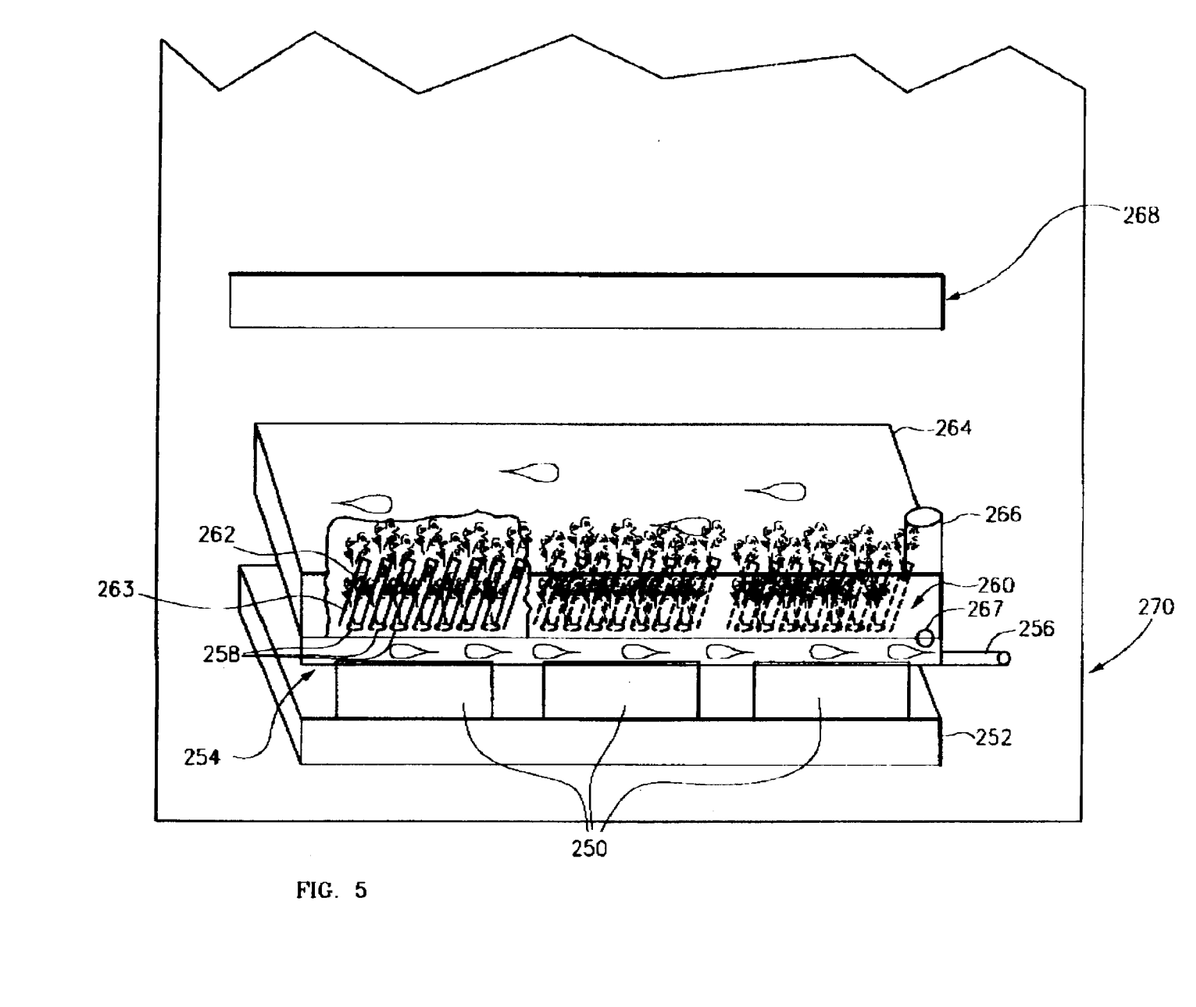
FIG. 5 is a cut-away view of a standard case for electronic circuit boards illustrating how an integral unit comprising a circuit board, components, heat sink, and environmental case assembled in accordance with the principles of the invention fits into such a case.

FIG. 5 illustrates an additional embodiment of the invention. Components 250 such as semiconductor devices are attached to integrated circuit board 252 and also are attached to or are integral with heat sink 254. Cooling fluid may be supplied under pressure to the interior of heat sink 254 via supply line 256. As detailed in FIGS. 1 and 1A and the accompanying description, the cooling fluid exits the interior of heat sink 254 through ports or nozzles 258 located on the base 260 of heat sink 254 and/or through ports or nozzles 262 located on the fins 263 of heat sink 254. Heat sink 254 may be enclosed in environmental case 264 to allow collection of the liquid and gaseous cooling fluid through ports 266 and 267. The circuit board 252, components 250, heat sink 254 and environmental case 264 may be constructed or adapted to be a signal integral unit and may be designed to fit standard sized slots such as slot 268 in standardized cases such as VME case designated generally as 270.

One alternative arrangement to that shown in FIG. 5 is to connect a manifold (not shown) to the bottom of circuit board 252. As detailed in U.S. patent application Ser. No. 09/465,428, circuit board 252, components 250, and heat sink 254 all may be perforated to allow cooling fluid to pass from the manifold (not shown) through the interior of components 250, and/or circuit board 252, through the interior of heat sink 254 and out through ports 258 and/or 262 on the surface of heat sink 254. The liquid and or gaseous cooling fluid may be collected by environmental container 264 and passed through ports 266 and 267 to be condensed, cooled and recycled back to the manifold (not shown).

There are multitudes of porting technologies available capable of providing axial, radial or other passages within components, heat sinks, circuit boards, and dies. Ultimately, creative engineering will enable these materials to become the most porous and exhibit a membrane-like emulation. The apparatus of the subject system may include generally utilized components such as radiators, intercoolers or compressors, as well as filters, pumps and regulators, which are not shown but are generally known within the art.

It is to be understood that a key aspect of the present invention resides in the continuous introduction of a cooling liquid capable of phase change. A continuous flow of these liquids through the integrated circuit board, heat sink, components, manifold and/or die provides for a more effective way to remove the heat from the energized electric components when compared to traditional methods and apparatus. In addition, the present invention may reduce electric interference in certain frequencies, thereby reducing or eliminating noise interference such as EMI and EMC, both internal and external to the system.

To achieve maximum efficiency of the internally injected cooling process the fluid should begin to vaporize near the surface of the component or heat sink. This ensures that the fluid has been adequately saturated with heat and maximum cooling efficiencies have occurred. This will occur near or at its boiling point and will allow for conductive cooling to occur at or near the core of any given component. For example, if the component's highest temperature occurs towards or at the core, then atomization or propagation of the minute droplets should be initiated via the design of the component. If the highest heat is near or at the surface of the component then conductive cooling in the core is suitable with atomization instilled near the surface. If there are varying degrees of heat the utilization of convection and atomization can be combined at different locations to maintain a homogenous temperature. This method is maintained through adequate porting within the component or heat sink and could require some spray cooling from an external source or a manifold with ported protrusions such as the manifold shown in FIG. 2 and described in the accompanying description. This can be achieved by matching flow rate and porting to achieve the best results.

It should be noted that this port/flow rate matching should consider the highest possible temperature anticipated for any given component or heat sink. The maximum operating capacity will yield thermally saturated fluid, initiating phase change, at or near the surface of an energized component at full load or at or near the surface of a heat sink that is associated with a component operating at full load. If the component operates at variable loads the system will provide conductive cooling i.e., without phase change during operation below its peak rating.

Micro machining for porting processes and atomization initiation processes capable of creating atomization membranes are well known to those skilled in the art and include EDP, CNC, laser cutting or etching methodology. The coil demonstrated in this art combined EDP and mesh technology as well as the use of increased surface area on the coil tube itself. It is anticipated that, for example, in the case of high power capacitor and microprocessors cooling, thin films, masking, vapor deposition, chemical etching techniques and layering could provide for excellent ways to create multiple matrix porting which become in effect membrane-like semiconductors composed of a conductive, semiconductive or dielectric anatomy. This technique will thermally homogenize molecules and atoms and create an equal distribution of the cooling medium through its pores. This effect will maximize thermal saturation and yield vapor in the most effective and efficient manner. Again, conductive and phase change cooling will occur at varying points to maximize cooling based on porting. The more effective intracellular transport for atomization and heat transfer the higher the power density becomes.

Figure 6:
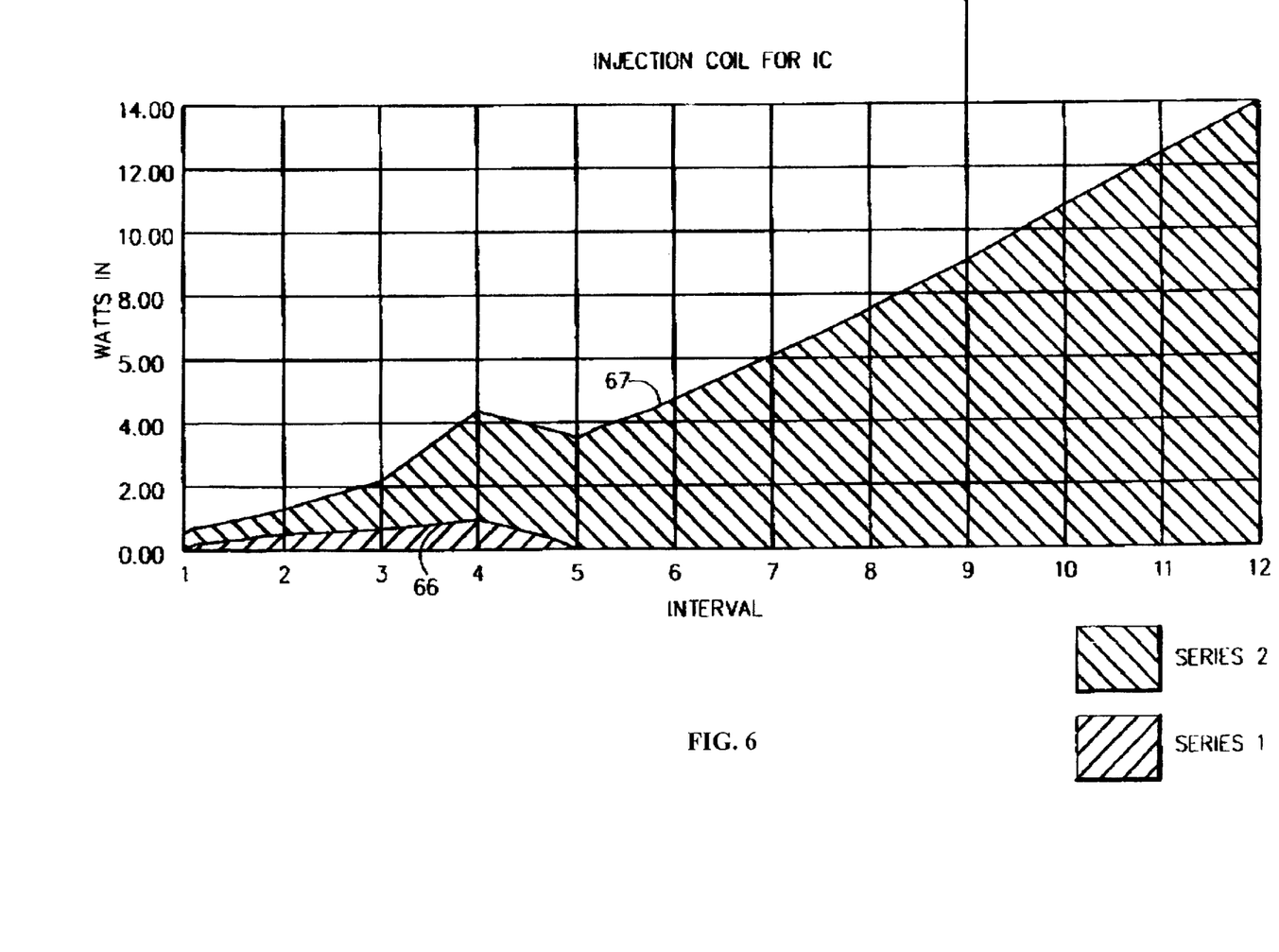
FIG. 6 is a graph of an injector coil for an integrated circuit illustrating the significant increases in power density that are possible when the coil is modified and cooled in accordance with the subject invention.

FIG. 6 illustrates the advantageous results derived from the present invention. This graph illustrates the significant increases in power density possible when power is delivered to a coil utilizing the principles of this invention. The first curve 300 identified as Series 1 shows the power density of the coil in a traditional manner of use. The second curve 302 identified as Series 2 indicates that a 16 times increase in power density is achieved when the coil is cooled in accordance with the principles of this invention. A minimum of a 32× increase in power anticipated by increasing the flow rate and/or boiling point of the fluid. The life of the coil was also extended by 3.5 times while achieving this increase in power density. Liquid halogenated hydrocarbons, such as fluorocarbons, capable of phase change were utilized as the cooling fluid in this particular test. Perfluorocarbons, such as Flourinert made by 3M, are preferred cooling liquids which are capable of phase change. Any such liquid may be utilized so long as it is compatible with the materials into which they are introduced. The following test data illustrates the principles of this invention. The tests were performed to measure the baseline for power density increases in electromagnetic coils. The test data compares an air-cooled coil to a fluid injected coil that is cooled in accordance with the principles of this invention. The air-cooled coil was a hand wound DC coil using copper wire with a dielectric coating. The core was galvanized iron pipe that had a diameter of 0.375 inches. The wire was 0.0155 inches in diameter. The pipe was four inches in length. The 4 inch long pipe had a hollow core through the center. A very fine single layer brass wire mesh was wrapped on the outside of the coil. Both ends of the coil were capped with a washer and a nut on each end. A thermistor was wound into the windings to indicate temperature.

The fluid injected coil was made the same as above, but the core was bored with 16 evenly spaced holes of 0.040 inches diameter. The holes bored in the core provided improved atomization. The tops of the holes were also scribed with a semi elliptical groove to help initiate atomization. There were two grooves 180 degrees apart and shaped like a crescent moon. A single layer of very fine brass wire mesh was wrapped about the windings. The wire mesh was epoxied along the ends in a manner so that it did not constrict the flow of fluids. From the core outwardly the holes were drilled in the core to inject and disperse the fluid evenly to the windings. A thermistor was wound into the windings to indicate temperature.

Digital meters monitored amperage, voltage and temperature of the coil during operation. An inline filter capable of removing particulates of 20–50 microns or smaller was utilized in the cooling inlet to the fluid injected coil.

in the test for fluid injected coil, a coil was placed in a condensation/vapor chamber which sufficiently sealed it to the air. A 5.5 inch stainless steel bowl was placed on top of the chamber to provide some additional heat exchange in addition to the outside surface of the chamber. Several ice cubes were placed in this bowl which had a surface area of 4 to 5 square inches for additionally cooled heat exchange via 35F +/− surface area to condensing chamber. A small pump was utilized to disperse the cooling fluid, Flourinert, at low volume to the inlet to the coil in the fluid injected coil test with tubing connecting the pump to the coil, filter and chamber drain back to the reservoir. An AC rectified to DC controller 0 to 90 volts provided the power to the coil.

In the test, each coil was run at 3 volts and increased by 2 volts every 2 minutes. At each voltage setting and subsequent time interval the readings were recorded. The following result were recorded:

| AIR COOLED COIL | | | | FLUID INJECTED COIL | | | |
|---|---|---|---|---|---|---|---|
| Reading | Time | Temp | Watts | Reading | Time | Temp | Watts |
| 1 | 1 | 82 | 0.135 | 1 | 1 | 69 | 0.28 |
| 2 | 2 | 105 | 0.355 | 2 | 2 | 72 | 0.77 |
| 3 | 4 | 161 | 0.602 | 3 | 4 | 75 | 1.48 |
| 4 | 6 | 254 | 0.855 | 4 | 6 | 82 | 2.42 |
| 5 | 7.15 | 287 | 0 | 5 | 8 | 95 | 3.45 |
| 6 | | | 0 | 6 | 10 | 102 | 3.40 |
| 7 | | | 0 | 7 | 12 | 114 | 4.59 |
| 8 | | | 0 | 8 | 14 | 123 | 6.00 |
| 9 | | | 0 | 9 | 16 | 136 | 7.37 |
| 10 | | | 0 | 10 | 18 | 147 | 9.04 |
| 11 | | | 0 | 11 | 20 | 159 | 10.73 |
| 12 | | | 0 | 12 | 22 | 179 | 12.16 |
| 13 | | | 0 | 13 | 24 | 195 | 13.70 |
| 14 | | | 0 | 14 | 26.75 | | |

Temp F. 73
Dewpoint 60%
Relative Humidity 62%
Barometric Pressure 29.92

As shown above, the air cooled coil failed at 7 minutes 9 seconds while the fluid injected coil lasted 26 minutes 45 seconds. The fluid injected coil provided an increased life in excess of 3.5 times that of the air cooled coil given an increase in power every two minutes in both tests. Also, at the same time, the fluid injection cooled coil was able to increase its total power input to 13.7 watts as compared to the air cooled coil at 0.855 watts. Thus, the fluid injected coil increased its power carrying capacity 16 times as compared to the air cooled coil. Again, at least a 32x increase is anticipated with a larger intercooler and or higher boiling fluid.

Although the invention has been described herein with references to specific embodiments, many modifications and variations therein will readily occur to those skilled in the art. Accordingly, all such variations and modifications are included within the intended scope of the invention.

What is claimed is:

1. A method for cooling a heat sink comprising:
   providing a heat sink with at least one interior passageway within said heat sink and at least one secondary passageway in fluid communication with said at least one interior passageway connecting said interior passageway to an exterior surface of said heat sink;
   providing means for supplying cooling fluid capable of phase change to said interior passageway;
   providing means for adjusting the rate at which said cooling fluid passes through said intenor passageway;
   adjusting the rate at which said cooling fluid passes through said interior passageway so that substantially no cooling fluid is vaporized within said interior passageway; and
   providing means for collecting and recycling said cooling fluid.

2. The method of claim 1 further comprising the step of adjusting the rate at which said cooling fluid passes through said interior passageway so that at least some of said cooling fluid vaporizes within said at least one secondary passageway prior to exiting said secondary passageway at the surface of said heat sink to cool said heat sink through both conductive and evaporative cooling.

3. The method of claim 1 further comprising the step of providing said heat sink with means for nebulizing said cooling fluid as said fluid exits said at least one secondary passageway.

4. The method of claim 3 wherein at least one of said means for nebulizing is a nozzle or a port.

5. A system for cooling an electrical component comprising:
   at least one electrical component,
   a heat sink having at least one interior passageway formed therein and a plurality of other passageways connecting said interior passageway to the exterior surface of said heat sink;
   said electrical component and said heat sink arranged to form a chamber that may be filled with pressurized cooling fluid between said electrical component and said heat sink;

said interior passageway in said heat sink connected to said chamber;

means for supplying pressurized cooling fluid capable of phase change to said chamber to flow through said interior passageways in said heat sink to conductively cool the interior of said heat sink and evaporatively cool the exterior surface of said heat sink; and means for collecting and recycling said cooling fluid.

6. A system as set forth in claim 5 wherein said electrical component is a coil.

7. A system as set forth in claim 5 wherein:

said electrical component has at least a first and second surface and at least one interior passageway formed therein;

said interior passageway in said component leading from said first surface to said second surface;

said interior passageway in said component connected to said chamber;

said means for supplying pressurized cooling fluid capable of phase change to said chamber supplies fluid to flow through (a) said interior passageway in said electrical component to conductively cool the interior of said electrical component and evaporatively cool the exterior surface of said component and (b) said internal passageways in said heat sink to conductively cool the interior of said heat sink and evaporatively cool the exterior surface of said heat sink; and means for collecting and recycling said cooling fluid.

8. A system as set forth in claim 7 wherein said electrical component is a coil.

9. A system as set forth in claim 5 wherein said electrical component is mounted on an integrated circuit board and said chamber is formed between said integrated circuit board and said heat sink.

10. A system as set forth in claim 7 wherein said electrical component is mounted on an integrated circuit board adapted to allow said internal passageway in said electrical component to communicate with said chamber and said chamber is formed between said integrated circuit board and said heat sink.

11. A system as set forth in claim 9 wherein said integrated circuit board includes at least one passageway therein to allow said cooling fluid to pass from said chamber to the surface of said integrated circuit board.

12. A system as set forth in claim 11 wherein said electrical component is a coil.

13. A system for cooling an electrical component comprising:

at least one electrical component having at least a first and second surface and at least one interior passageway formed therein;

said interior passageway in said component leading from said first surface to said second surface;

means for supplying a cooling fluid capable of phase change to said interior passageway in said component to conductively cool the interior of said component evaporatively cool the exterior surface of said component;

an environmental housing having an interior surface for containing and collecting the cooling fluid; and heat sink material located between the component and said environmental housing.

14. A system as set forth in claim 13 wherein said heat sink material abuts a surface of said electrical component to enhance uniform vaporization of the cooling fluid.

15. A system as set forth in claim 13 wherein said heat sink material abuts the interior surface of said environmental housing to enhance the condensation of said cooling fluid.

16. A system for cooling an electronic component comprising:

at least one electronic component;

a heat sink attached to said at least one electronic component;

said heat sink having at least one interior passageway within said heat sink and at least one secondary passageway in fluid communication with said at least one interior passageway connecting said interior passageway to an exterior surface of said heat sink;

means for supplying cooling fluid capable of phase change to said interior passageway;

means for adjusting the rate at which said cooling fluid passes through said interior passageway so that substantially no cooling fluid is vaporized within said interior passageway; and means for collecting and recycling said cooling fluid.

17. A system as set forth in claim 16 wherein said electronic component, said heat sink, and said means for collecting and recycling said cooling fluid all are adapted to form one integrated unit.

18. A system as set forth in claim 16 wherein said system is adapted to fit into a standard size slot in a standard case for containing electronic components.

19. A system as set forth in claim 17 wherein said system is adapted to fit into a standard size slot in a standard case for containing electronic components.

20. A system for cooling an integrated circuit board and its components comprising:

a cooling manifold having a surface for receiving at least one circuit board, die, or heat sink;

said cooling manifold having at least one interior passageway therein;

said interior passageway connected to the surface of said cooling manifold;

means for supplying pressurized cooling fluid capable of phase change to said interior passageway to conductively cool said cooling manifold and to flow through said interior passageway to the surface of said cooling manifold to cool the exterior surface of said cooling manifold at least partially by evaporative cooling;

means for adjusting the rate at which said cooling fluid passes through said interior passageway so that substantially no cooling fluid is vaporized within said interior passageway;

means for collecting and recycling said cooling fluid.

21. A system as set forth in claim 20 further comprising:

at least one protrusion from the surface of said cooling manifold;

at least one other passageway connecting said interior passageway to the exterior surface of said protrusion to direct said cooling fluid toward a predetermined target to at least partially cool the surface of said predetermined target by evaporative cooling.

22. A system as set forth in claim 20 including a port or nozzle for nebulizing said cooling fluid.

23. A system as set forth in claim 21 including a port or nozzle for nebulizing said cooling fluid.

* * * * *